United States Patent
Lu et al.

(10) Patent No.: US 6,171,151 B1
(45) Date of Patent: *Jan. 9, 2001

(54) ISOLATION MODULE FOR RJ-45 MODULAR JACK

(75) Inventors: Peter Lu, Flower Mound, TX (US); Jeffrey Heaton, Cupertino; James W. Heaton, Los Altos, both of CA (US); Peter Loh Hung Pao, Kowloon (HK); Robert Loke Hang Lam, Kowloon (HK); Tsang Kei Sun, Kowloon (HK)

(73) Assignee: Halo Electronics, Inc., Redwood City, CA (US)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 09/019,770

(22) Filed: Feb. 6, 1998

Related U.S. Application Data

(63) Continuation-in-part of application No. 08/773,555, filed on Dec. 27, 1996, which is a continuation-in-part of application No. 08/513,573, filed on Aug. 10, 1995, now Pat. No. 5,656,985.

(51) Int. Cl.⁷ .......................... H01R 13/66; H01R 33/945

(52) U.S. Cl. ............................................. 439/620

(58) Field of Search .................... 439/620, 676, 439/941

(56) References Cited

U.S. PATENT DOCUMENTS

| | | | |
|---|---|---|---|
| 3,721,747 | 3/1973 | Renskers | 174/52 PE |
| 4,703,991 | 11/1987 | Philippson | 439/676 |
| 4,944,698 | 7/1990 | Siemon et al. | 439/676 |

(List continued on next page.)

FOREIGN PATENT DOCUMENTS 0 490 438 A1  6/1992 (EP).

OTHER PUBLICATIONS

McCormick; Surface Mount Transformers: A New Packaging Approach; Surface Mount Technology; Feb. 1993; pp. 27–31.

Wyns et al.; PSPICE Simulations and 3D–PCB Transformers for ZVS Full Bridge Converters; The European Power Electronics Association; 1993; pp. 208–214.

(List continued on next page.)

Primary Examiner—Lincoln Donovan
Assistant Examiner—Javaid Nasri
(74) Attorney, Agent, or Firm—Trial & Technology Law Group

(57) ABSTRACT

An isolation module for an RJ-45 modular jack provides isolation and noise control and reduction for the RJ-45 modular jack. The RJ-45 modular jack includes a front surface having an opening for receiving a corresponding modular plug. The RJ-45 modular jack further includes a plurality of electrical fingers arranged in a spring bias fashion within the opening in the front surface for making electrical contact with a modular plug. The RJ-45 modular jack includes a series of sockets or slots along the back surface of said modular jack such that the electrical fingers extend to the back side of the modular jack and terminate in a reverse bent fashion to form a socket or clip portion within a respective socket or slot. The isolation module interconnects with the back surface of the RJ-45 modular jack, the isolation module including a top portion, side walls and end walls [and an open bottom], a plurality of electrical contacts extending from the bottom portion of said side walls and extending below the bottom of the side walls of the isolation module, at least one toroid transformer contained within said isolation module, the toroid transformer having wires electrically connected to the module contacts, the extended contacts inserted within the socket or clip portion of the modular jack to form an interconnection between the isolation module and the modular jack.

5 Claims, 6 Drawing Sheets

U.S. PATENT DOCUMENTS

| | | | |
|---|---|---|---|
| 5,096,442 | 3/1992 | Arnett et al. | 439/676 |
| 5,139,442 * | 8/1992 | Sakamoto et al. | 439/620 |
| 5,178,554 | 1/1993 | Siemon et al. | 439/188 |
| 5,178,563 | 1/1993 | Reed | 439/676 |
| 5,194,014 | 3/1993 | McClune et al. | 439/404 |
| 5,348,484 | 9/1994 | Sorrentino | 439/101 |
| 5,411,405 | 5/1995 | McDaniels et al. | 439/131 |
| 5,503,572 | 4/1996 | White et al. | 439/676 |
| 5,531,612 | 7/1996 | Goodall et al. | 439/541.5 |
| 5,538,448 | 7/1996 | Tsao | 439/874 |
| 5,626,497 | 5/1997 | Bouchan et al. | 439/676 |
| 5,628,653 | 5/1997 | Haas et al. | 439/607 |
| 5,639,262 * | 6/1997 | Lim | 439/607 |
| 5,639,266 | 6/1997 | Patel | 439/676 |
| 5,639,267 | 6/1997 | Loudermilk | 439/701 |
| 5,647,765 | 7/1997 | Haas et al. | 439/609 |
| 5,647,770 | 7/1997 | Belopolsky | 439/676 |
| 5,687,233 | 11/1997 | Loudermilk et al. | 379/442 |
| 5,697,817 | 12/1997 | Bouchan | 439/676 |
| 5,702,271 | 12/1997 | Steinman | 439/676 |
| 5,704,802 | 1/1998 | Loudermilk | 439/490 |
| 5,736,910 | 4/1998 | Townsend et al. | 333/181 |
| 5,766,043 * | 6/1998 | Talend | 439/676 |

OTHER PUBLICATIONS

EPE'93 Fifth European Conference; Power Electronics and Applications; vol. 3: Electronic Power Supply System; Sep. 13–16, 1993; pp. 215.

Davis; SMT Passive Components Fit Power Electronics Applications; PCIM; Jun. 1993; vol. 19; No. 6; pp. 20–28 and 90.

Osawa; A Superminiaturized Double–Balanced SMT Mixer–Modulator; Microwave Journal; Feb. 1994; pp. 90–97.

Lyons et al.; Printed Circuit Board Magnetics: A New Approach to the Mass Production of Toroidal Transformers; ISHM '95 Proceedings; pp. 53–58. No month.

Derebail et al.; Knowledge Based Adhesive Selection for SMT Assemblies; Proceedings 1995 International Symposium on Microelectronics; Oct. 24–26, 1995; vol. 2649; pp. 1024–1035.

* cited by examiner

ISOLATION MODULE FOR RJ-45 MODULAR JACK

CROSS REFERENCE TO RELATED APPLICATIONS

The present application is a continuation-in-part application of application Ser. No. 08/773,555, filed Dec. 27, 1996, which is a continuation-in-part of application Ser. No. 08/513,573, filed Aug. 10, 1995, now U.S. Pat. No. 5,656,985, issued Aug. 12, 1997, both of which are assigned to the same assignee as the present application and priority is claimed herein under the benefit of Title 35, United States Code, Section 120.

BACKGROUND OF THE INVENTION

The present invention relates to an isolation module for an RJ-45 type electrical connector. RJ-45 electrical connectors are modular jacks and are well known in the art. Such modular jacks are utilized in telecommunication, data communication and networking applications. Modular jacks and the corresponding modular plugs are durable, reliable, and generally inexpensive, with electrical conductors or contacts held inside a molded plastic body. The modular jacks generally have a rectangular opening into which the plug is inserted in order to make electrical connections.

In telecommunication and networking applications, it is important to provide isolation and noise level reduction. Typically, RJ-45 modular jacks are connected to a printed circuit board (PCB). It is known in the art to locate a magnetic device as close as possible to the RJ-45 modular jack in order to achieve improved isolation and reduce and control the noise level.

It would be desirable to provide an RJ-45 modular jack type electrical connector which allows for improved isolation and reduced and controlled noise level.

SUMMARY OF THE INVENTION

It is an object of the present invention to provide an isolation module for an RJ-45 type modular jack.

In one embodiment, the present invention provides an isolation module for an RJ-45 modular jack which has improved isolation and noise control and reduction for the RJ-45 modular jack. The RJ-45 modular jack includes a front surface having an opening for receiving a corresponding modular plug. The RJ-45 modular jack further includes a plurality of electrical fingers arranged in a spring bias fashion within the opening in the front surface for making electrical contact with a modular plug. The RJ-45 modular jack includes a series of sockets or slots along the back surface of said modular jack and the electrical fingers extend to the back side of the modular socket and terminate in a reverse bent fashion to form a socket or clip portion within a respective socket or slot.

The isolation module interconnects with the back surface of the RJ-45 modular jack, the isolation module including a top portion, side walls and end walls [and an open bottom]. A plurality of electrical module contacts extend from the bottom portion of said side walls and extend below the bottom of the side walls of the isolation module. In one embodiment, the isolation module includes at least one toroid transformer and/or common mode choke or other electronic components contained within the isolation module, the toroid transformers having wires electrically connected to the module contacts. The extended module contacts are inserted within the socket or clip portion of the modular jack to form an interconnection between the isolation module and the modular jack.

Other objects, features and advantages of the present invention will become apparent from the following detailed description when taken in conjunction with the accompanying drawings.

BRIEF DESCRIPTION OF THE DRAWINGS

The accompanying drawings, which are incorporated in and form a part of this specification, illustrate embodiments of the invention and, together with the description, serve to explain the principles of the invention.

DETAILED DESCRIPTION OF THE PREFERRED EMBODIMENTS

Figure 1A:
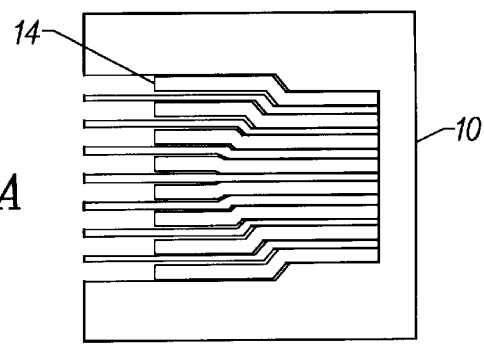
FIG. 1A shows a top view of an RJ-45 modular jack.

Reference will now be made in detail to the preferred embodiments of the invention, examples of which are illustrated in the accompanying drawings. While the invention will be described in conjunction with the preferred embodiments, it will be understood that they are not intended to limit the invention to those embodiments. On the contrary, the invention is intended to cover alternatives, modifications and equivalents, which may be included within the spirit and scope of the invention as defined by the appended claims.

FIGS. 1A–1D show an RJ-45 modular jack type electrical connector 10 according to the present invention. An RJ-45 connector is a modular jack that connects a twisted pair telephone line and a printed circuit board (PCB) on a computer or in a networking device such a router, hub-switch, or the like.

As indicated above, it is known to be beneficial to the operation of the RJ-45 modular jack to include, for example, a magnetic device (such as a toroid transformer) which provides isolation and reduces and controls the noise level. It is beneficial to locate the magnetic device as close as possible to the RJ-45 modular jack, or to the transmission line coming in or the transmission line going out.

The present invention provides an isolation module which includes a component which provide isolation and reduces the noise level and is placed as close as possible to the RJ-45 modular jack. The isolation module includes electrical module leads or contacts which are connected in a socket like fashion to the back end of the RJ-45 modular jack, as will be described. As will be described, the present invention meets FCC mechanical and dimensional requirements; would be customer configurable and repairable; can be adapted for single and multiport versions (single row and double height); can be utilized with 4, 6, 8, or 10 position housings; has an industry standard footprints; can be adapted with shielding options (tin-plated brass); has the smallest body length in the industry jacks with magnetics); saves board spacing; and minimizes EMI (Electro-Magnetic Interference) from reduced board traces.

In one embodiment, the isolation module also includes one or more toroid transformers electrically connected to the module leads. Other types of electrical and/or magnetic components can be utilized with the isolation module according to the present invention, depending upon application requirements. For example, different types of toroid transformers may be utilized with the isolation module according to the present invention. Other types of transformers, magnetics or other electrical components may also be utilized as well. The isolation module according to the present invention allows for a great degree of varying the circuits required.

In addition, if there is a failure, the isolation module can easily be removed from the RJ-45 modular jack and replaced with another isolation module, or with a different circuit. In other words, the isolation module according to the present invention allows for significant flexibility and ease for telecommunication and network applications.

Figure 1D:
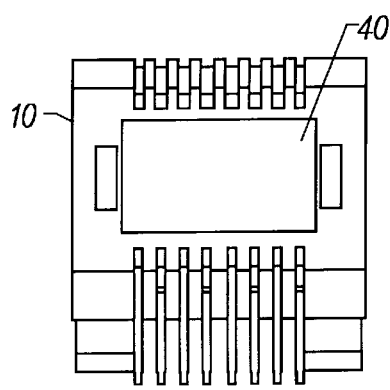
FIG. 1D shows a back view of the RJ-45 modular jack of FIG. 1A.
Figure 1B:
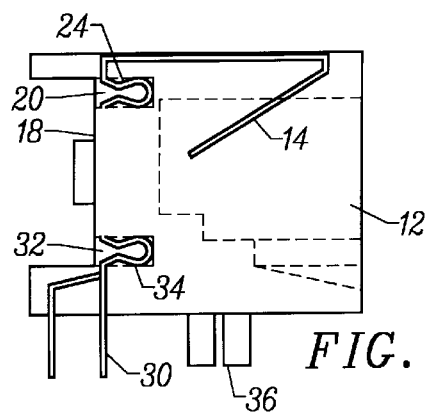
FIG. 1B shows a side cross section view of the RJ-45 modular jack of FIG. 1A.

FIG. 1B shows a side cross section view of an RJ-45 modular jack 10 according to the present invention. The modular jack 10 in FIG. 1B has an opening or cavity 12 for receiving a corresponding modular plug (not shown). The modular jack 10 includes jack finger leads or contacts 14 which are spring biased for making electrical contact with a plug when inserted into opening 12. The jack leads 14 are extended along the top portion of modular jack 10 to the back wall or portion 18 of jack 10. The jack leads 14 are shown bent around to be contained within socket or slot 20 to form a socket or clip portion 24.

FIG. 1A shows a top view of the RJ-45 modular jack 10 including sixteen electrical contacts (or fingers) 14. As is known, RJ-45 modular jacks use eight lines for computer applications.

Figure 1C:
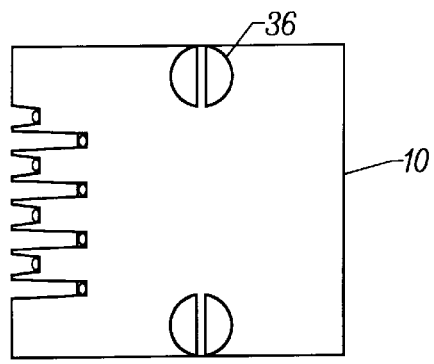
FIG. 1C shows a bottom view of the RJ-45 modular jack of FIG. 1A.

In FIG. 1B, the metal fingers 14 provide a spring action for making electrical contact with a corresponding contact with a modular plug (not shown for simplicity purposes) which may be inserted in space 12. The metal fingers make electrical contact with the corresponding contacts of the modular plug. In FIG. 1B, the contacts 14 are extended toward the back side 18 of the modular jack 10 and are bent within socket or slot 20 so as to form a socket or clip portion 24. Similarly, finger 30 is bent so as to form a socket or clip portion 34 within socket or slot 32, as also shown in FIG. 1B. FIGS. 1B and 1C show a side and bottom views of the RJ-45 modular jack, with plastic posts 36 which are inserted into a PCB in a known fashion. FIG. 1D shows a back view of the RJ-45 modular jack 10 into which the isolation module according to the present invention is to be interconnected at location 40.

Figure 2:
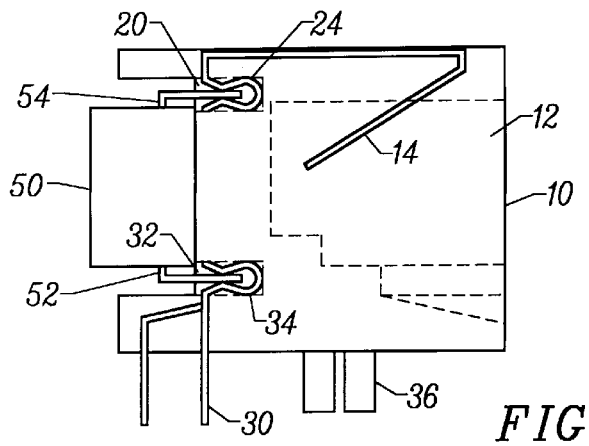
FIG. 2 shows the isolation module of the present invention interconnected to the modular jack of FIGS. 1A–1D.

FIG. 2 shows the RJ-45 modular jack 10 of FIGS. 1A–1D interconnected with the isolation module 50 according to the present invention in which module leads or terminals 54, 52 are inserted into the respective socket or slot portion 20, 32 on the back portion of the modular jack 10. The module terminals 54, 52 of the isolation module 50 are inserted into the respective socket or clip portions 24, 34 within the socket 20, 32 so as to form a secure interconnection.

Figure 3:
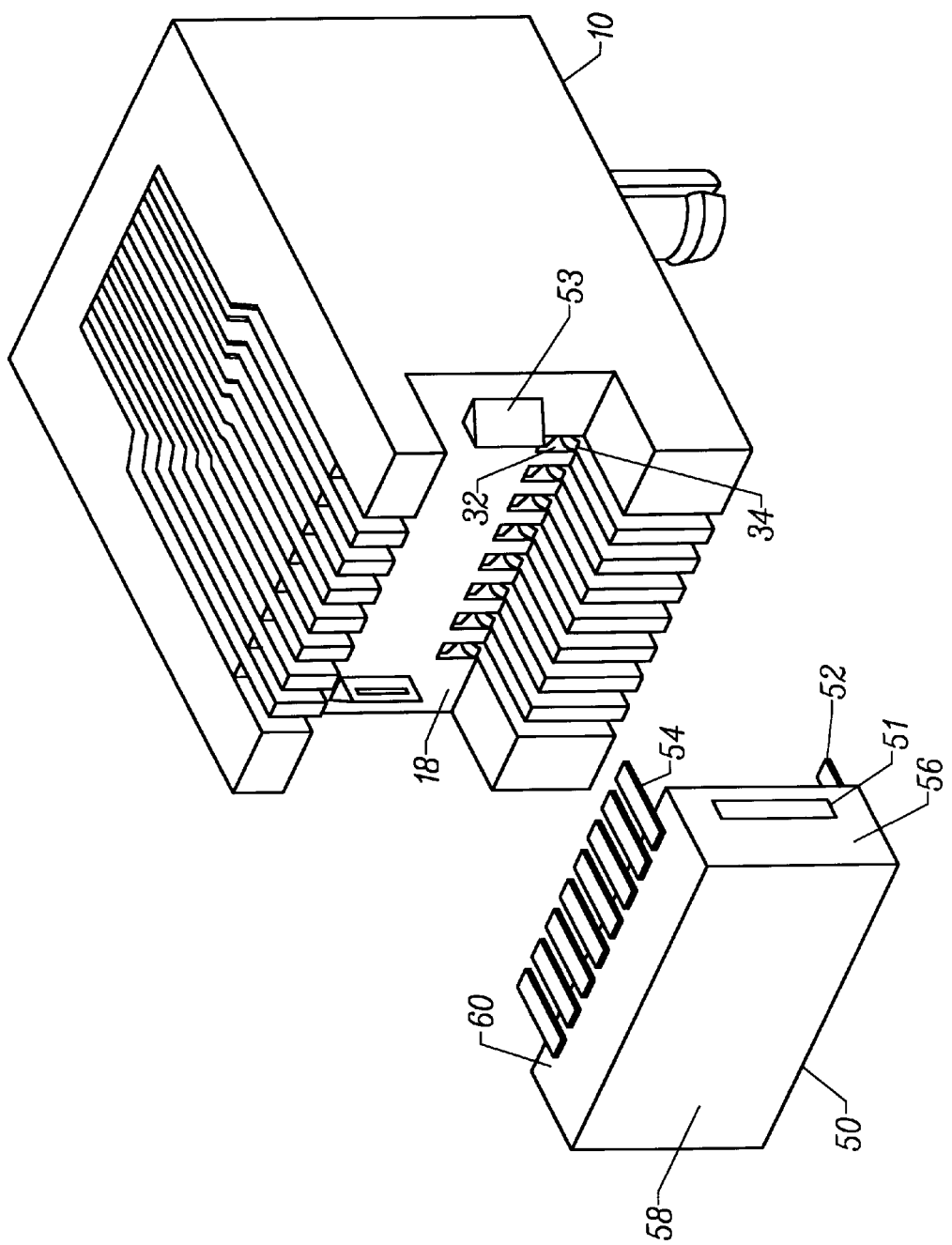
FIG. 3 shows an exploded perspective view of the isolation module and modular jack of FIG. 2.
Figure 4:
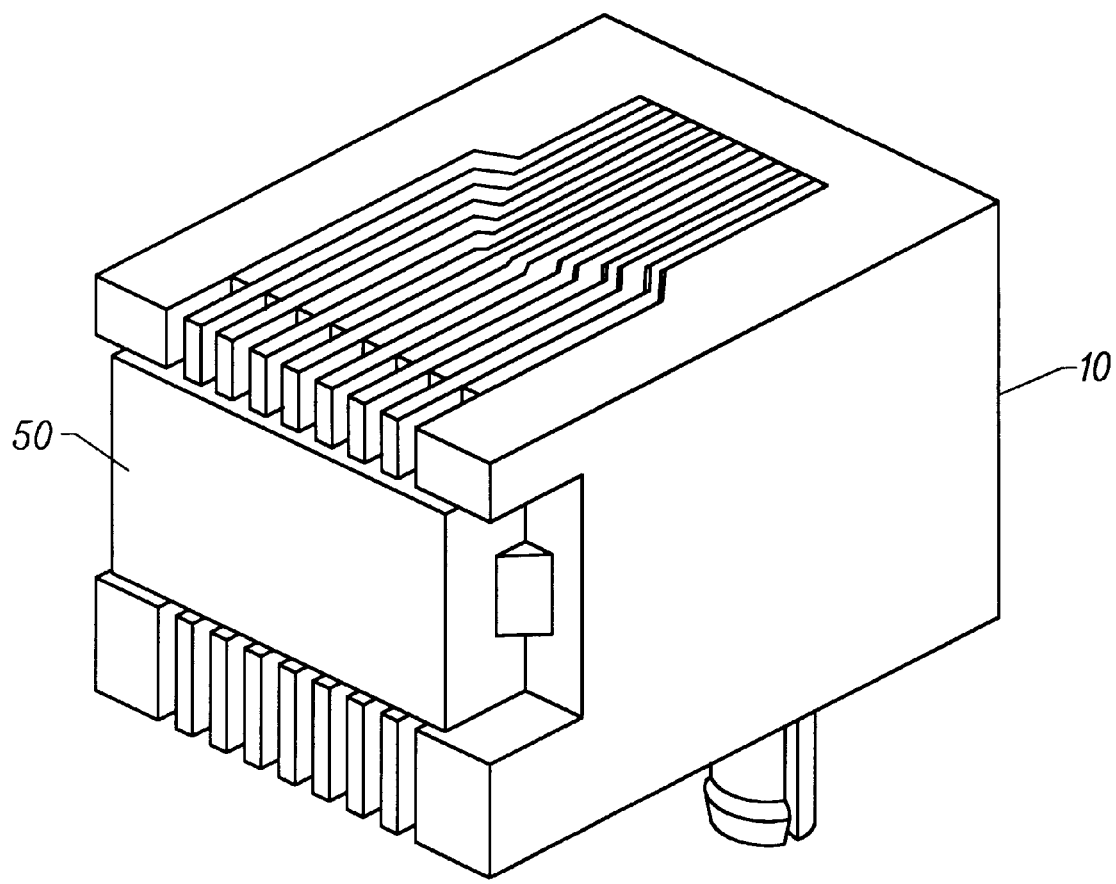
FIG. 4 shows a perspective view of the isolation module interconnected to the modular jack according to the present invention.

In one embodiment, the isolation module 50 could include a ridge or nub arrangement 51 on the end portions which would engage with a spring device arrangement 53 of the modular jack 10, as shown in FIG. 3, which acts like a clip that holds the isolation module 50 in place, as shown in FIG. 4.

In FIG. 3, the isolation module 50 has side walls 60, end walls 56 and top portion 58. The isolation module 50 has module leads 54, 52 extending from the bottom portion of the side walls 60. The isolation module 50 can contain different types of electrical and/or magnetic devices for providing the desired isolation and noise reduction. For example, in one embodiment as shown in FIG. 5, the isolation module 50 could include one or more toroid transformers 62 contained within the isolation module 50. The toroid transformers 62 are electrically connected by wires 64 to the terminals 54, 52, which extend below the bottom of the side walls 60 of isolation module 50, which terminals 54, 52 are then inserted into the respective sockets or slots 20, 32 containing the socket or clip portions 24, 34 of modular jack 10. The terminals 54, 52 fit securely within the socket portions 24, 34 in the RJ-45 modular jack 10, so that soldering is unnecessary. A nub/spring arrangement 51, 53 as previously mentioned provides for protection against shock and vibration.

FIG. 4 shows a back perspective view of the present invention, with the isolation module 50 inserted into the modular jack 10.

Figure 5B:
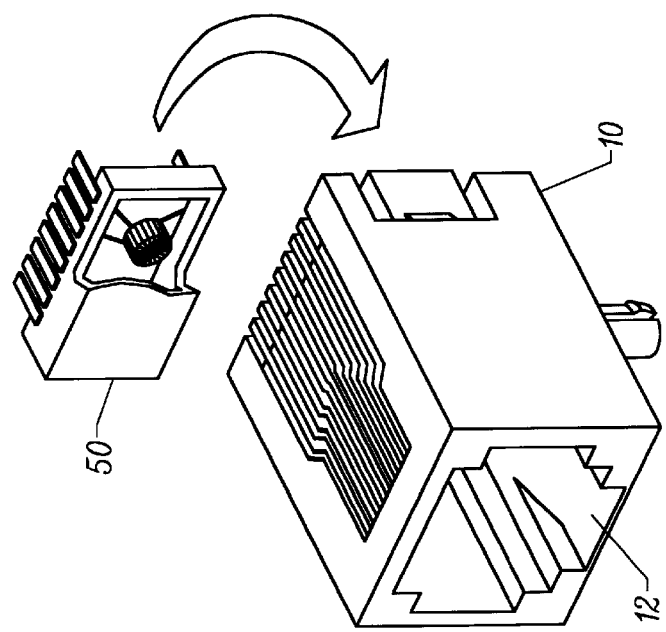
FIGS. 5A and 5B show a back and front exploded perspective view of the isolation module and RJ-45 modular jack, respectively, wherein the isolation module includes a toroid transformer.
Figure 5A:
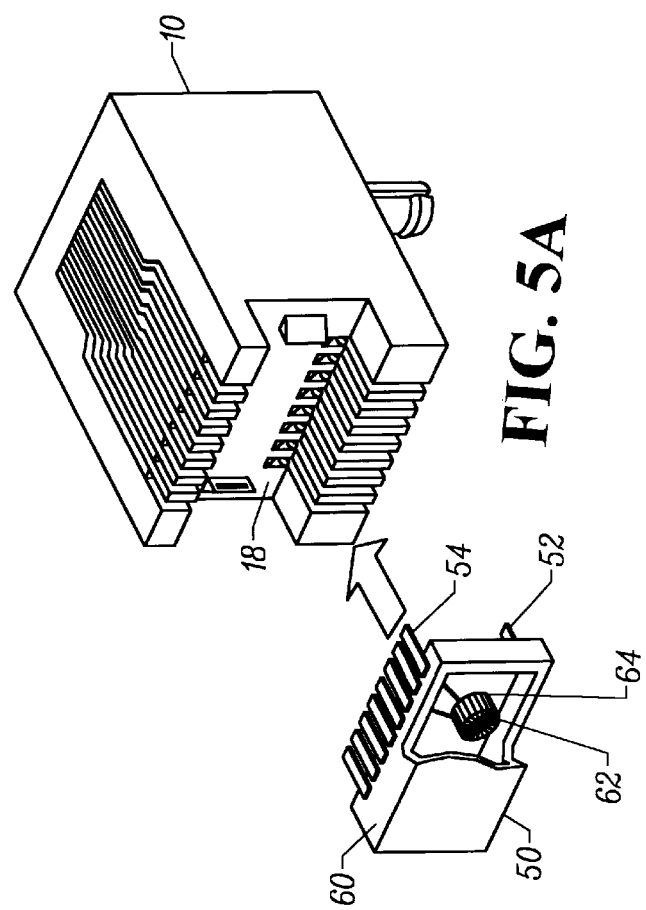

FIG. 5A shows a back perspective exploded view of the present invention in which the isolation module 50 includes, as an example, a toroid transformer 62 contained within the isolation module 50. The toroid transformer 62 is electrically connected by wires 64 to the terminals 54, 52 which extend below the side wall 60 of the isolation module 50. The terminals 54, 52 can be inserted into the respective socket or clip portions 24, 34 contained with the socket 20, 32 of the modular jack 10.

FIG. 5B shows a front perspective view of the present invention of FIG. 5A. The toroid transformers 62 of FIG. 5 could be carried or contained within the isolation module 50 by a soft silicone type material (e.g., soft epoxy). Also, the isolation module shown in FIG. 5 has an open bottom; however, the present invention is not limited to such a configuration (a closed bottom configuration might be suitable, depending upon application requirements). In addition, in a preferred embodiment, the module leads 54, 52 in FIG. 5 extending from the side portion 60 of isolation module 50 below the bottom of the side portion 60 so as to be inserted into the respective socket portions 24, 34 of modular jack 10. However, in a suitable application, the module leads could extend from the very bottom edge of side portion 60 of isolation module 50.

Figure 6:
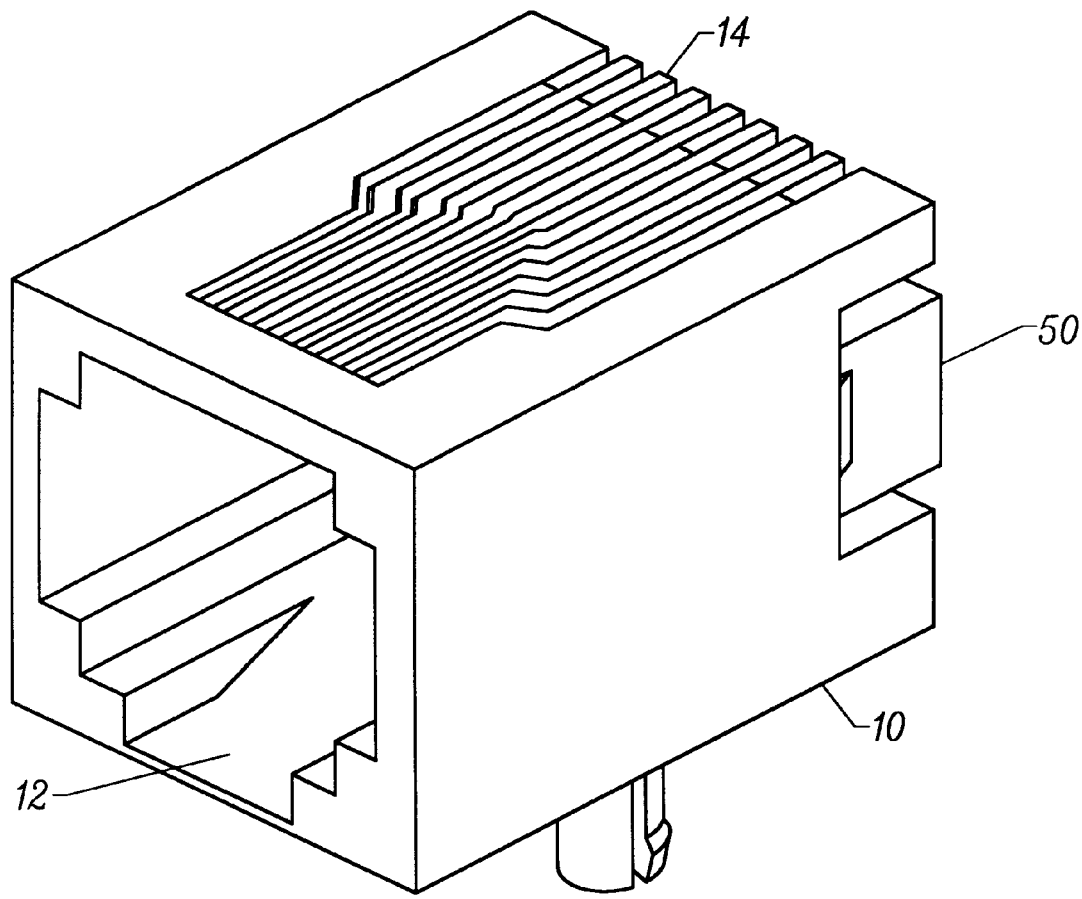
FIG. 6 shows a front perspective view of the isolation module connected to the RJ-45 modular jack according to the present invention.

FIG. 6 shows a front perspective view of the isolation module interconnected to the back side of RJ-45 modular jack 10.

Figure 7:
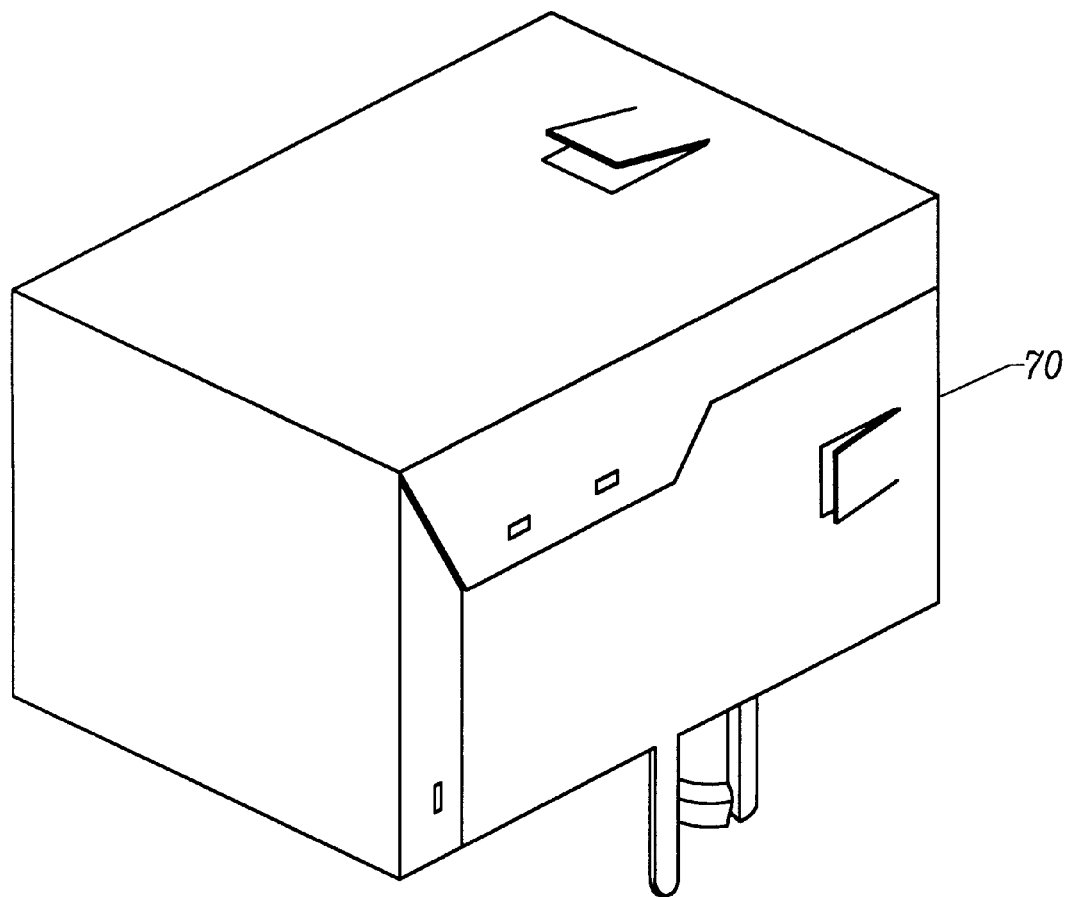
FIG. 7 shows a view of shielding for the isolation module interconnection to the modular jack of FIG. 4.

FIG. 7 shows a view of the present invention with a shield 70 on isolation module and RJ-45 modular jack. In an application such as a local area network (LAN), a shield such as shown in FIG. 7 is required.

The RJ-45 modular jacks can come individually as shown in FIGS. 1–7, or in blocks of 2 or 4, single row, or in blocks of four on a bottom row and four on a top row (dual height).

As should be apparent from FIGS. 1–7, the present invention would meet FCC mechanical and dimensional requirements; would be customer configurable and repairable; can be adapted for single and multiport versions (single row and double height); can be utilized with 4, 6, 8, or 10 position housings; has an industry standard footprints; can be adapted with shielding options (tin-plated brass); has the smallest body length in the industry (Jacks with magnetics); saves board spacing; and minimizes EMI from reduced board traces.

The isolation module interconnected to the RJ-45 modular jack according to the present invention has one advantage of having a magnetic noise reduction/isolation device as close to the contacts as possible. The isolation module is placed in line with the RJ-45 modular jack which is in turn connected to the PCB.

Another advantage according to the present invention is the ease of varying the circuit required. A user of the present invention may have application requirements of any number of different types of circuits in order to achieve the desired goals Each user may have slightly different requirements depending upon the particular application. The isolation module and RJ-45 modular jack according to the present invention allows for great flexibility, since the isolation module can be easily removed and replaced with another isolation module with different circuitry, thereby providing a user with great flexibility with respect to engineering, production and quality control.

The foregoing descriptions of specific embodiments of the present invention have been presented for purposes of illustration and description. They are not intended to be exhaustive or to limit the invention to the precise forms disclosed, and it should be understood that many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. An electrical connector assembly comprising:
   an RJ-45 modular jack, said RJ-45 modular jack including a front surface having an opening for receiving a corresponding modular plug, said RJ-45 modular jack having a first plurality of electrical fingers arranged in a spring bias fashion within said opening for making electrical contact with said modular plug, said RJ-45 modular jack with space for at least eight fingers and including a series of first slots along a back surface of said RJ-45 modular jack, said electrical fingers extending to the back surface of said RJ-45 modular jack and terminating in a reverse bent fashion to form first clip portions within respective first slots,
   a second plurality of electrical fingers, one end of said second fingers terminating in second clip portions in reverse bent fashion in a second series of slots along said back surface of said RJ-45 modular jack, an other end of said second fingers terminating as electrical pins extending out of a bottom portion of said RJ-45 modular jack,
   an isolation module for interconnecting with the back surface of said RJ-45 modular jack, said isolation module including a top, side walls and end walls, a plurality of pairs of electrical extending contacts extending from a bottom of said side walls and extending below a bottom of said isolation module for connection to the first and second clip portions of the RJ-45 modular jack, an isolation/noise control component contained within said isolation module, said isolation/noise control component electrically connected to one end of said extending contacts, another end of each of said extending contacts insertable within a respective one of the first and second clip portions of said fingers within the slots of said RJ-45 modular jack to form an interconnection between said pairs of first and second clip portions of said RJ-45 modular jack and said electrical contacts extending below said bottom of said isolation module, said isolation/noise control component forming an electrical path between respective fingers of each of said first plurality of electrical fingers and each of said second plurality of electrical fingers.

2. The electrical connector assembly of claim 1 wherein said isolation/noise control component is a toroid transformer.

3. The electrical connector assembly of claim 1 wherein said isolation/noise control component is a toroid choke.

4. In an electrical connector assembly including an RJ-45 modular jack, said RJ-45 modular jack including a front surface having an opening for receiving a corresponding modular plug, said RJ-45 modular jack having a first plurality of electrical fingers arranged in a spring bias fashion within said opening for making electrical contact with said modular plug, said RJ-45 modular jack with space for at least eight said fingers and including a series of slots along a back surface of said RJ-45 modular jack, each said electrical fingers extending to the back surface of said modular jack and terminating in a reverse bent fashion to form a first clip portion within respective slots,
   a second plurality of electrical fingers, one end of said second fingers terminating in second clip portions in reverse bent fashion in a second series of slots along said back surface of said RJ-45 modular jack, another end of said second fingers terminating as electrical pins extending out of a bottom portion of said RJ-45 modular jack;
   an isolation module for interconnecting with the back surface of said RJ-45 modular jack, said isolation module comprising:
   a top, side walls and end walls and an open bottom, a plurality of electrical extending contacts extending from the bottom of said side walls and extending below the bottom of said isolation module for connection to the first and second clip portions of the RJ-45 modular jack, an isolation/noise control component contained within said isolation module electrically connected to said extending contacts, each of said extending contacts insertable within a respective one of the first and second clip portions of said RJ-45 modular jack to form an interconnection between said RJ-45 modular jack and said isolation module, said isolation/noise control component contained within said isolation module forming an electrical path between respective fingers of the first plurality of electrical fingers and the second plurality of electrical fingers.

5. In an electrical connector assembly including an isolation module for interconnecting with a back surface of an RJ-45 modular jack, said isolation module including a top portion, side walls and end walls, a plurality of pairs of electrical contacts, a contact of each said pairs extending from the bottom portion of each said side walls and extending below the bottom of said isolation module with space for at least eight pairs of said contacts for connection to first and second clip portions of the RJ-45 modular jack, an isolation/noise control component contained within said isolation module, said control component electrically connected to said contacts, said RJ-45 modular jack comprising:

a front surface having an opening for receiving a corresponding modular plug, said RJ-45 modular jack having a plurality of at least eight electrical first fingers arranged in a spring bias fashion within said opening for making electrical contact with said RJ-45 modular plug, said RJ-45 modular jack including a series of first slots along the back surface of said RJ-45 modular jack, said electrical first fingers extending to the back surface of said modular jack and terminating in a reverse bent fashion to form said first clip portions within the respective first slots;

a plurality of electrical second fingers, one end of said second fingers terminating in said second clip portions in reverse bent fashion in a second series of slots along a lower portion of said back surface of said RJ-45 modular jack, the other end of said second fingers terminating as electrical pins extending out of a bottom portion of said RJ-45 modular jack;

said pairs of extending electrical contacts insertable within respective one of the first and second clip portions of the RJ-45 modular jack to interconnect said isolation module to said RJ-45 modular jack; and said isolation/noise control component contained within said isolation module forming an electrical path between respective fingers of each said first plurality of electrical fingers and each said second plurality of electrical fingers.

* * * * *